United States Patent [19]

Quinn

[11] E Re. 31,545

[45] Reissued Mar. 27, 1984

[54] FEED-FORWARD AMPLIFIER

[75] Inventor: Patrick A. Quinn, Beaverton, Oreg.

[73] Assignee: Tektronix, Inc., Beaverton, Oreg.

[21] Appl. No.: 227,286

[22] Filed: Jan. 22, 1981

Related U.S. Patent Documents

Reissue of:

[64] Patent No.: 4,146,844
Issued: Mar. 27, 1979
Appl. No.: 846,743
Filed: Oct. 31, 1977

[51] Int. Cl.[3] ..... H03F 1/26; H03F 3/45

[52] U.S. Cl. ..... 330/149; 330/151; 330/252; 330/311

[58] Field of Search ..... 330/149, 151, 252, 311

[56] References Cited

U.S. PATENT DOCUMENTS

| | | | |
|---|---|---|---|
| 3,689,752 | 9/1972 | Gilbert | 330/252 X |
| 3,944,944 | 3/1976 | Ellenbecker | 330/149 |
| 4,048,577 | 9/1977 | Shinn | 330/252 X |

*Primary Examiner*—James B. Mullins
*Attorney, Agent, or Firm*—George T. Noe

[57] ABSTRACT

A high-precision amplifier employs a feed-forward technique to provide a first order correction of amplifier distortion. A second amplifier is utilized to sense the base-to-emitter distortion of a main amplifier and develop an error output which is injected into an output node to provide cancellation of distortion from the output of the main amplifier. The feed-forward distortion-correction technique is particularly applicable to high-precision wideband differential amplifiers; however, the technique may be used in other amplifiers as well.

8 Claims, 7 Drawing Figures

FIG. 4
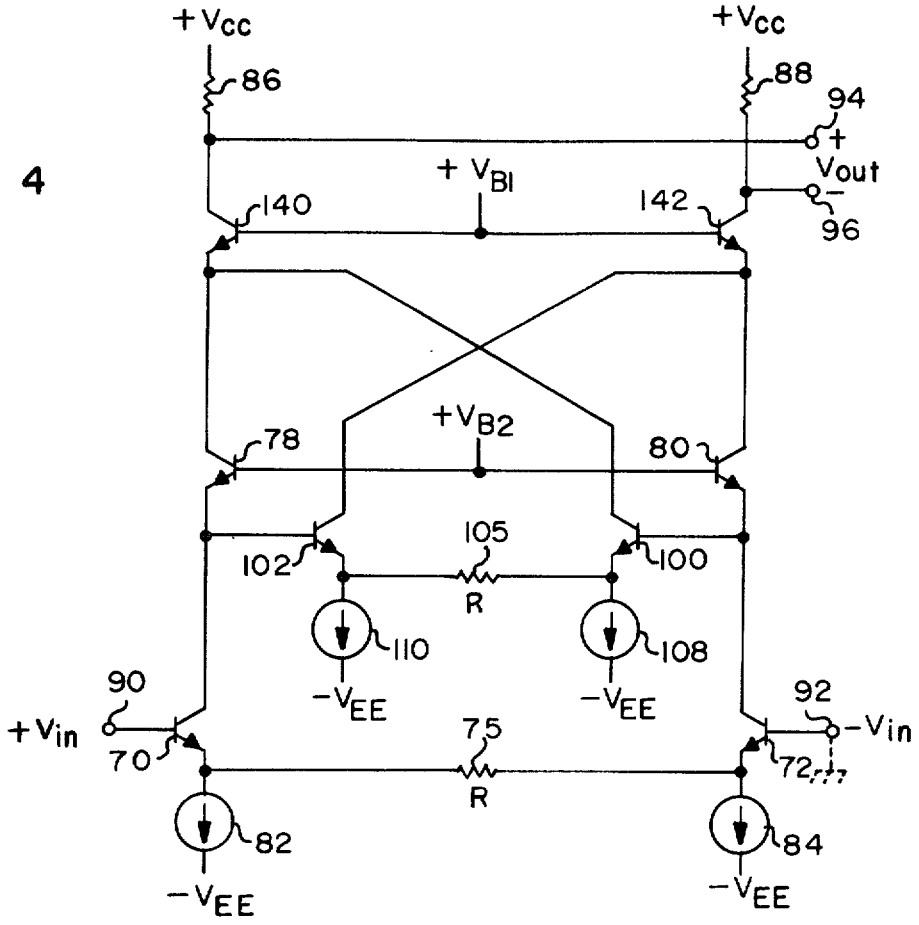
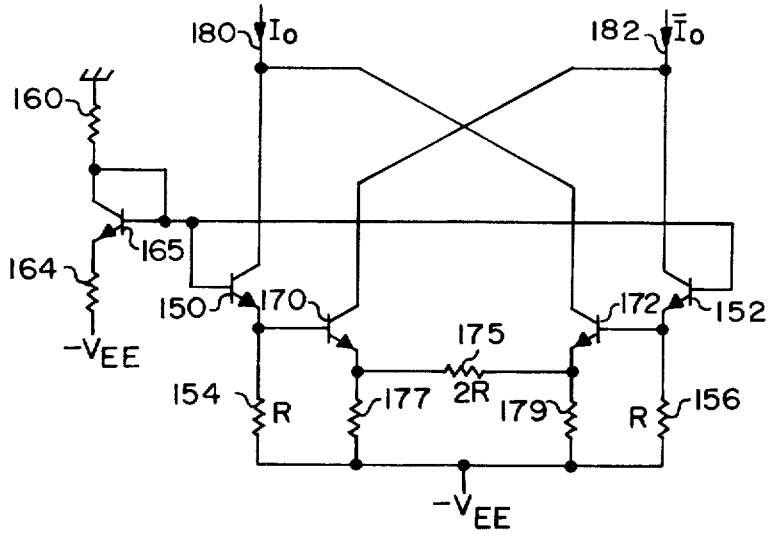
FIG. 5

FEED-FORWARD AMPLIFIER

Matter enclosed in heavy brackets [ ] appears in the original patent but forms no part of this reissue specification; matter printed in italics indicates the additions made by reissue.

BACKGROUND OF THE INVENTION

Two major sources of amplifier error are nonlinearity and thermal distortion. The mechanisms which produce these undesirable traits are inherent in the fundamental physical properties of semiconductor pn junctions. The signal-amplitude error in an uncompensated wide-band amplifier may be as high as ten percent; however, the incorporation into the circuit of complex compensating networks permits sophisticated measurement instruments to have a rated amplifier precision in the one- to three-precent range.

There are many applications in which amplifiers having a high degree of precision, e.g., 0.01 to 0.1 percent, are required, particularly in measurement instruments. One well-known method of reducing amplifier error is through the use of feedback techniques. In feedback amplifiers, the final output is sensed and fed back to the input so that linearity errors and thermal distortion are cancelled to a large degree. While feedback amplifiers having very high precision may be designed, such high-precision feedback amplifiers are intended for only very low frequency operation because they have several limitations which make them unsuitable for high-precision wide-band signal processing. For example, adequate damping becomes difficult to obtain as the frequency increases. Also, small inherent time delays around the feedback loop to the input cause the output to be out of phase with the input. Thus, phase distortion is introduced and such phase distortion increases as the frequency increases, degrading amplifier precision accordingly. While some operational amplifiers are capable of wide-band operation to perhaps several hundred megahertz, DC operational amplifiers having precision in the 0.001 to 0.01 percent range have a maximum effective bandwidth from DC to only 20 or 50 kilohertz since precision degrades rapidly at the higher frequencies.

SUMMARY OF THE INVENTION

In accordance with the present invention, a high-precision wideband amplifier employs a feed-forward technique to provide a first order correction of amplifier distortion. A correction amplifier is coupled to a main amplifier to sense the base-to-emitter distortion thereof and develop an error signal which is injected into an output node to provide cancellation of distortion from the output of the main amplifier.

In a differential amplifier embodiment, a main amplifier comprises a first emitter-coupled pair of transistors which receive a differential signal at the bases thereof. The respective bases of a second emitter-coupled pair of correction amplifier transistors are coupled to the emitters of the first pair of transistors. The respective collectors of the second pair of transistors are cross coupled to the collectors of the first pair of transistors to provide a pair of output summing nodes. This intercoupled configuration provides an inherently stable feed-forward amplifier in which a correction amplifier senses the base-to-emitter signal distortion of the main amplifier and injects an error correction signal into the output nodes to provide an error-free differential output signal. Thus is can be seen that errors caused by transistor non-linearities and thermal distortion are corrected as they occur. Precision in the 0.01 to 0.1 percent range is maintained over a frequency range of from DC to about 200 megahertz.

Other amplifier configurations employing a feed-forward technique include a cascode differential amplifier for high-speed operation above 500 megahertz, and a differentially-matched constant-current source.

It is therefore one object of the present invention to provide a novel high-precision amplifier in which a feed-forward technique is utilized to provide a first order correction of amplifier distortion.

It is another object to provide a high-precision, wide-band feed forward amplifier in which transistor non-linearity and thermal distortion are compensated without introducing phase distortion.

It is a further object to provide a stable, high-precision amplifier constructed of few parts and being simple in operation.

It is an additional object to provide a high-precision, wideband amplifier having precision in the range of 0.01 to 0.1 percent and a frequency range of from DC to about 500 megahertz.

Other objects and advantages of the present invention will become apparent to those having ordinary skill in the art when taken in conjunction with the accompanying drawings.

BRIEF DESCRIPTION OF THE DRAWINGS

FIG. 4 is a schematic diagram of a cascode feed-forward amplifier in accordance with the present invention; and FIG. 5 is a schematic diagram of a feed-forward differentially-matched current source in accordance with the present invention.

DETAILED DESCRIPTION

Figure 1:
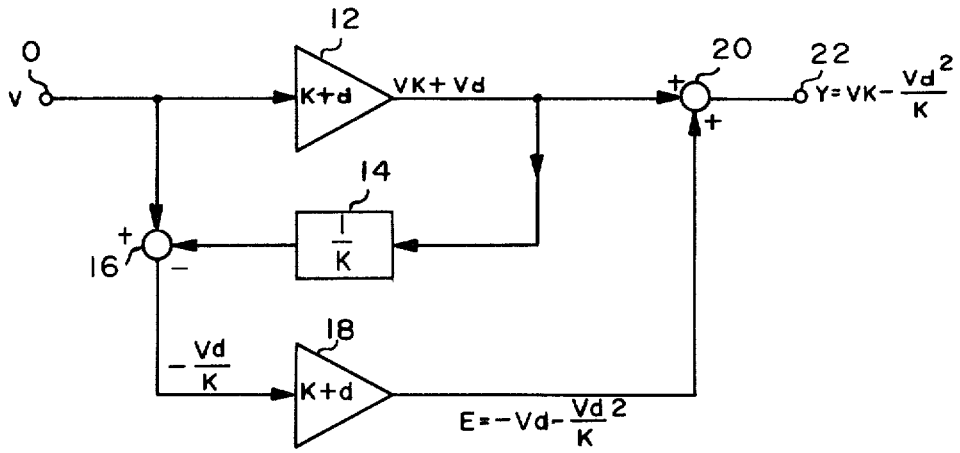
FIG. 1 is a block diagram of an amplifier having a feed-forward correction channel employed in explaining the present invention.

Referring to the block diagram of FIG. 1, an input signal V is applied via an input terminal 10 to an amplifier 12. Amplifier 12 has a gain factor K which is modified by a certain amount of distortion d inherent in amplifier, so that the transfer function thereof is (K + d). The output of amplifier 12 is fed through a network 14, whose complex transfer function is the reciprocal of the complex gain factor K of amplifier 12, to an algebraic summing node 16, where the modified signal $$\left(V + \frac{Vd}{K}\right)$$

is substracted from the input signal V. This algebraically summed signal is applied to an amplifier 18, which has substantially the same gain and distortion characteristics as amplifier 12, to produce an error signal $$E = -\left(Vd + \frac{Vd^2}{K}\right).$$

The error signal E is applied to an algebraic summing node 20 where it is summed with the amplifier 12 output to produce an output signal $Y = VK - Vd^2/K$, which is available at output terminal 22. Note that distortion component is now a second order term divided by the amplifier gain factor. For example, for $K = 10$ and $d = 0.1$, the output distortion component $$\frac{d^2}{K} = 0.001,$$

which for practical purposes is negligible. The feed forward path through network 14, summing node 16, and amplifier 18 has no substantial inherent delays, and thus is substantially as "fast" as the main amplifier channel for frequencies to above 500 megahertz.

Figure 2:
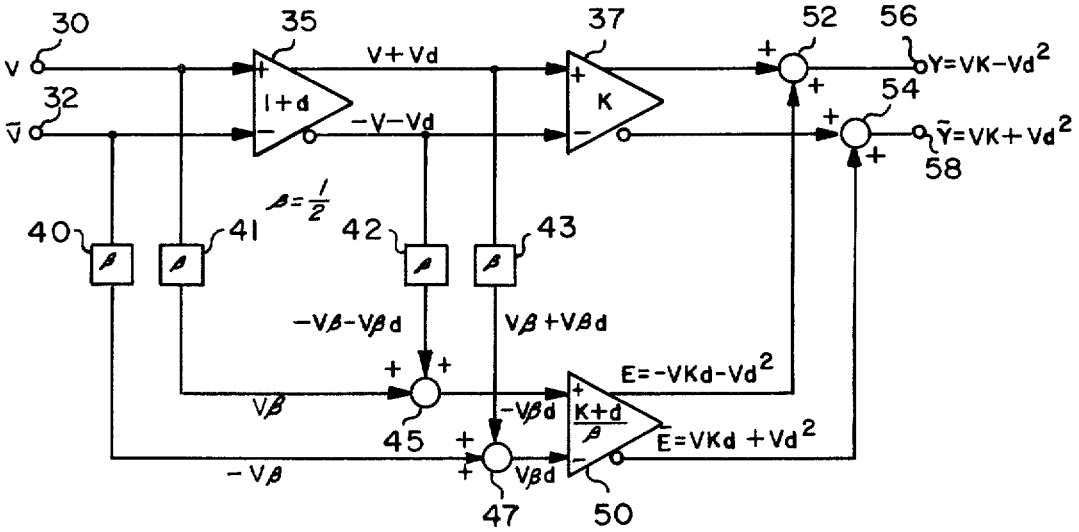
FIG. 2 is a block diagram of a differential amplifier having a feed-forward channel employed in explaining the present invention.

The block diagram of FIG. 2 illustrates a feed-forward amplifier having a differential amplifier configuration. Differential input signals V and V are applied via input terminals 30 and 32 respectively to a differential amplifier main channel comprising amplifiers 35 and 37. The amplifier portion 35 includes a distortion-producing mechanism which may be, for example, the base-to-emitter junction of one or more transistors, so that the transfer function of this portion is $(1+d)$. Four identical networks 40–43, each having a transfer function $\beta$, and a pair of algebraic summing nodes 45 and 47 are utilized to sum the undistorted and distorted signals to provide respective input signals $-V\beta d$ and $V\beta d$ to a correction amplifier 50, which has a transfer function $$\frac{K + d}{\beta}$$

The networks 40–43 may suitably be passive voltage dividers having a ratio of $\beta = \frac{1}{2}$. The gain of correction amplifier is modified by the factor $1/\beta$ so that the complementary error-signal outputs E and $\overline{E}$ therefrom are not affected thereby. The complementary error signals from correction amplifier 50 are summed with the complementary outputs of the main amplifier 37 at summing nodes 52 and 54 to produce corrected output signals Y and $\overline{Y}$ at output terminals 56 and 58 respectively. As described hereinabove, the distortion component is a second order term and is thus minimized.

Figure 3A:
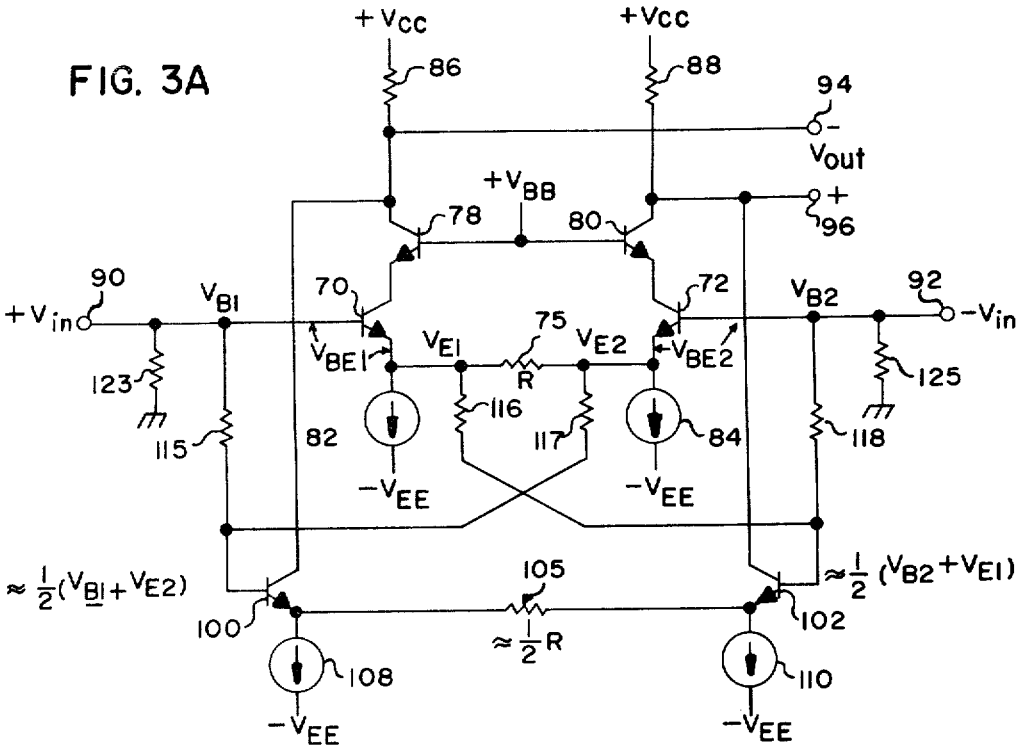
FIG. 3A is a schematic diagram of a differential feed-forward amplifier in accordance with the present invention.

FIG. 3A shows a circuit schematic of a differential feed forward amplifier which is an actual circuit representation of the mathematical model of FIG. 2. The main amplifier channel includes a pair of transistors 70 and 72, the emitters of which are coupled together through a resistor 75. The collectors of transistors 70 and 72 are connected to the emitters of a pair of common-base amplifier stage transistors 78 and 80, while the emitters thereof are connected to a suitable source of negative voltage $-V_{EE}$ through current sinks 82 and 84 respectively. The collectors of transistors 78 and 80 are connected to a suitable source of positive voltage $+V_{CC}$ through collector-load resistors 86 and 88 respectively, while the bases of transistors 78 and 80 are connected to a suitable source of biasing voltage $+V_{BB}$. Differential input signals $+V_{in}$ and $-V_{in}$ are applied to a pair of input terminals 90 and 92, and the overall amplifier output is taken from the collectors of transistors 78 and 80 via output terminals 94 and 96 respectively. The portion of the amplifier just described, which comprises the main amplifier channel of a differential feed-forward amplifier in accordance with the present invention, is a conventional differential cascode amplifier. The differential input signal is developed across emitter resistor 75; however, because of the base-to-emitter voltages $V_{BE1}$ and $V_{BE2}$ of transistors 70 and 72, and the inherent distortion characteristics thereof, the signal voltage developed across resistor 75 is distorted. That is, while the differential signal $V_{B1} - V_{B2}$ is applied across the bases of transistors 70 and 72, a differential signal $V_{E1} - V_{E2}$ is developed across resistor 75.

The correction amplifier comprises transistors 100 and 102, the emitters of which are coupled together through a resistor 105. The collectors of transistors 100 and 102 are connected to the collectors of transistors 78 and 80 respectively, while the emitters thereof are connected to a suitable source of negative voltage $-V_{EE}$ through current sinks 108 and 110 respectively. The main amplifier 70–72 base voltages $V_{B1}$ and $V_{B2}$ are arithmetically combined with the distorted emitter voltages $V_{E2}$ and $V_{E1}$ respectively by means of a resistive attenuator network comprising four resistors 115–118 all having approximately the same value of resistance so that the summed voltage at the base of transistor 100 is approximately equal to $\frac{1}{2}(V_{B1} + V_{E2})$ and the summed voltage at the base of transistor 102 is approximately equal to $\frac{1}{2}(V_{B2} + V_{E1})$. The resistance value of resistor 105 is chosen to be approximately one-half the value of resistor 75 in this embodiment so that the collector current of transistors 100 and 102 is appropriately scaled with the collector current of transistors 70 and 72. The summed load currents flowing through load resistors 86 and 88 are substantially error free, producing corrected output signals which may be defined by the mathematic terms Y and $\overline{Y}$ described hereinabove in conjunction with the block diagram model of FIG. 2. Input resistors 123 and 125 are provided to establish a predetermined input resistance $R_{in}$, for example, 50 ohms.

For best results, the active devices should be pretty well matched. The FIG. 3A embodiment has operated satisfactorily at frequencies exceeding 200 megahertz while maintaining a precision value between 0.01 and 0.1 percent. This circuit is inherently very stable, and is particularly attractive for realization in integrated-circuit form. Resistors 115–118 may suitably be on the order of 100 ohms each, as long as the values of R are correctly chosen. The following design equations are given for finding the appropriate values of R:

$$R_{115} = R_{118};\ R_{116} = R_{117};\ R_{123} = R_{125} \tag{1}$$

$$R_{in} = R_{123}\tfrac{1}{2}(R_{115} + R_{117} + h_{ib,\,Q70}) \tag{2}$$

$$R_{115} = h_{ib,\,Q70} + R_{117}\left(\frac{2h_{ib,\,Q70}}{R_{75}} + 1\right) \tag{3}$$

$$R_{105} = \frac{R_{115}}{h_{fb,\,Q70}(R_{115} + R_{117})}\ \frac{2R_{75}R_{116}}{R_{75} + 2R_{116}} \tag{4}$$

Overall amplifier transconductance is $$\frac{1}{r_T} = \frac{h_{fb_{Q70}} h_{fb_{Q78}} R_{116}}{R_{115} \frac{2R_{75}R_{116}}{R_{75} + 2R_{116}}} \quad (5)$$

Figure 3B:
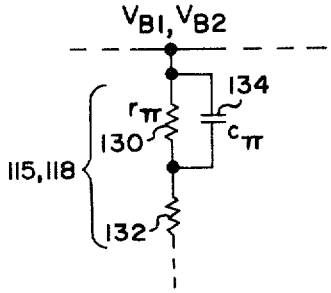
FIG. 3B shows a transistor-modeling network which may be incorporated into the circuit of FIG. 3A.

Better high frequency behavior can be achieved by replacing resistors 115 and 118 of FIG. 3A with the network of FIG. 3B on each side of the amplifier. The network of FIG. 3B comprises two resistors 130 and 132 in series, with resistor 130 bypassed by a capacior 134. Resistor 130 and capacitor 134 are assigned values of $r_\pi$ and $c_\pi$ respectively to match the $r_\pi$ and $c_\pi$ parameters of hybrid-$\pi$ models of transistors 70 and 72. The value of resistor 132 is then chosen to provide the overall $R_{115}$, $R_{118}$ value calculated in accordance with equation (3) set forth hereinabove.

Figure 3C:
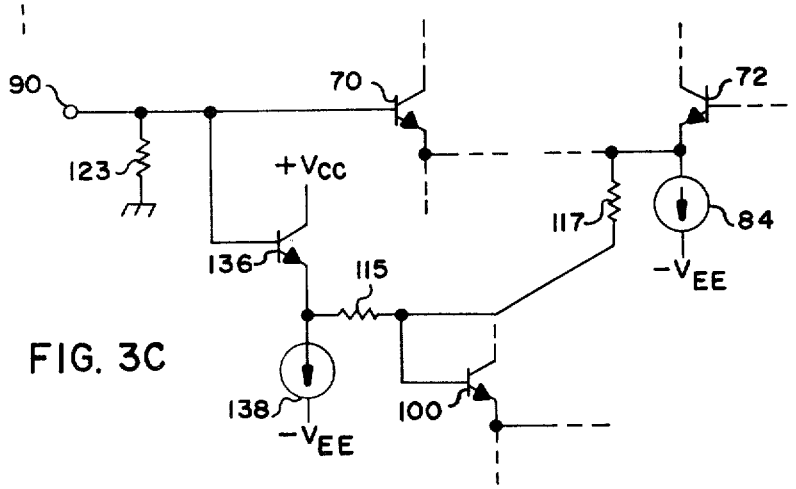
FIG. 3C shows an alternative transistor-modeling circuit which may be incorporated into the circuit of FIG. 3A.

For higher precision with the FIG. 3A circuit, however, an additional pair of transistors substantially matching transistors 70 and 72 is inserted into the circuit as shown in the partial schematic of FIG. 3C, in which only one side of the circuit is shown for simplicity. It can be seen that resistor 115 has been disconnected from the base of transistor 70 and reconnected to the emitter of newly-added resistor 136, the base of which is connected to the base of transistor 70. The collector of transistor 136 is connected to the positive voltage supply $+V_{CC}$, while the emitter thereof is returned to the negative voltage supply $-V_{EE}$ through a current sink 138. Transistor 136 is substantially identical to transistor 72, and current sink 138. Transistor 136 is substantially identical to transistor 72, and current sink 138 is substantially identical to current sink 84 so that the distortion-producing mechanisms are matched. Of course, it is understood that an identical transistor is inserted into the circuit between the base of transistor 72 and resistor 118 to match the distortion-producing mechanisms of transistor 70. For this alternative embodiment, resistors 115, 116, 117, and 118 may be of equal value. In addition to better matching of coupling impedances, input impedance $R_{in}$ may be set by the value of resistors 123 and 125. The high precision provided by this alternative embodiment comes at the expense of current, and consequently, power, thrown away by transistor 136 and its counterpart on the opposite side of the circuit. Additionally, frequency response is reduced. However, if the circuit is realized in integrated-circuit form, the power losses may be minimized by appropriately scaling the junction areas of the added transistors to the junction areas of transistors 70 and 72. The distortion caused by the base-emitter junction of transistor 136 may be minimized by choosing sufficiently large resistance values for resistors 115–118.

FIG. 4 illustrates an additional cascode feed-forward amplifier configuration wherein similar elements are referred to with like reference numerals, each stage of the amplifier substantially corresponding to the FIG. 3A embodiment. This configuration differs from that previously described in that the correction amplifier transistors 102 and 100 are connected to the collector circuit of main amplifier transistors 70 and 72 respectively, eliminating the voltage divider networks. This configuration has the advantage of higher-speed operation as well as fewer parts, and is inherently stable as well. The resistance of resistor 105 is substantially equal to that of resistor 75, so that the correction amplifier channel has the same gain and bandwidth as the main amplifier channel. One version of this configuration that was investigated has a wideband frequency range in excess of 500 megahertz. An additional cascode stage comprising common base amplifier transistors 140 and 142 is inserted between the collector-current summing nodes and the load resistors 86 and 88 to reduce thermal distortion in the lower transistors. A phantom ground is shown connected to terminal 92, since the circuit may be operated by applying a single-ended input to input terminal 90.

The characteristics of transistors 70, 72, 78, and 80 should be as evenly matched as possible, and the collector-to-emitter voltages thereof should be substantially equal so that power dissipation is equal, because in this embodiment transistors 78 and 80 are utilized to model the distortion-producing mechanisms of transistors 70 and 72. Thus the dynamic power dissipation in the upper transistor pair should substantially match that of the lower pair. Two additional advantages of this circuit are that its overdrive characteristics are similar to a conventional difference amplifier, and the input impedance is simple to establish.

Since fewer parts are employed by the FIG. 4 cascode feed-forward amplifier, such configuration is ideally adapted to planar NPN semiconductor integrated circuit fabrication. Of course, discrete transistors may alternatively be employed; however, it is easier to match components in integrated circuit construction to ensure high performance of the circuit. Furthermore, since the voltage swings occuring in the integrated circuit tend to be quite small, capacitance problems are also substantially avoided or eliminated.

FIG. 5 shows a schematic diagram of a differentially-matched current source employing a feed-forward technique in accordance with the present invention. Main amplifier transistors 150 and 152 are differentially coupled through respective emitter resistors 154 and 156, the junction of which is connected to the negative supply $-V_{EE}$. The bases of transistors 150 and 152 are connected together to a stable source of reference voltage, which in this case is a voltage divider comprising resistors 160 and 164 and a diode-connected transistor 165 serially disposed between ground and the supply $-V_{EE}$. The correction amplifier comprises transistors 170 and 172, the emitters of which are coupled together through an emitter resistor 175. The collector of transistors 170 and 172 are cross coupled to the collectors of transistors 152 and 150 respectively, while the emitters of transistors 170 and 172 are connected to the negative supply $-V_{EE}$ through resistors 177 and 179. All of the emitter resistors 154, 156, 175, 177, and 179 are chosen to appropriately scale the collector current from the four transistors. Differentially-matched currents $I_o$ and $\bar{I}_o$ are available on output lines 180 and 182. As is apparent from this configuration, any change or drift in the base-to-emitter voltages of transistors 150 or 152 causes a differential signal to be developed at the bases of transistors 170 and 172, which in turn inject into the output nodes 180 and 182 the proper amount of current to maintain currents $I_o$ and $\bar{I}_o$ constant. The standing currents in the transistors 170 and 172 may be substantially less than that conducted by transistors 150 and 152.

While I have shown and described preferred embodiments of my invention, it will be apparent to those skilled in the art that many changes and modifications may be made without departing from my invention in its broader aspects. The appended claims therefore cover all such changes and modifications as fall therewithin.

What I claim as being new is:

1. A feed forward amplifier, comprising:

a main amplifier channel comprising a first emitter coupled pair of transistors for receiving an input signal and producing an amplified signal therefrom;

network means coupled to the bases and emitters of said first emitter coupled pair of transistors for producing distortion signals proportional to the distortion caused by the base-to-emitter junctions of said first pair of transistors;

a feed forward channel comprising a second emitter coupled pair of transistors for receiving said distortion signals and producing a correction signal therefrom; and means for coupling the collectors of said first and second pairs of transistors together in algebraic summing relationship so that said correction signal is summed with said amplified signal to provide a substantially error-free output signal.

2. An amplifier in accordance with claim 1 wherein said network means includes a first pair of matched resistors coupled to the respective bases of said first pair of transistors and a second pair of matched resistors coupled to the respective emitters of said first pair of transistors, said first and second pairs of resistors being cross connected to provide at the junctures thereof said distortion signals.

3. An amplifier in accordance with claim 2 wherein said network means further includes semiconductor junction modeling means interposed between said first pair of resistors and said bases of said first pair of transistors to increase amplifier precision by modeling the distortion-producing mechanism.

[4. An amplifier in accordance with claim 1 wherein the bases of said second emitter coupled pair of transistors are coupled respectively to the collectors of said first emitter coupled pair of transistors, the collectors of said second pair of transistors being cross coupled to the collectors of said first pair of transistors for producing differential output signal currents by combining said amplified signal with said correction signal.]

5. An amplifier in accordance with claim 1 wherein the bases of said first emitter coupled transistors are connected to a bias current source and the bases of said second emitter coupled pair of transistors are coupled between the emitters of said first pair of transistors, the collectors of said second pair of transistors being cross coupled to the collectors of said first pair of transistors for producing differentially-matched output currents by combining said amplified signal with said correction signal.

*6. A feed forward amplifier comprising:*

*an emitter-coupled pair of input transistors having a predetermined resistance in the emitter path thereof;*

*a first pair of transistors connected in common-base configuration, the emitters of which are connected to respective collectors of said input transistors;*

*an emitter-coupled pair of correction transistors having a predetermined resistance in the emitter path thereof so as to match the gain of said correction transistors with said input transistors, the bases of said correction transistors being connected to respective collectors of said input transistors and the collectors thereof being cross-coupled to the respective collectors of said first pair of common-base transistors to provide collector-current summing nodes; and*

*a second pair of transistors connected in common base configuration to provide an output signal, the emitters of which are connected to respective collector current summing nodes.*

*7. A feed forward amplifier, comprising:*

*a main amplifier channel comprising a first emitter coupled pair of transistors for receiving an input signal and producing an amplified signal therefrom;*

*a pair of common base amplifier transistors, the emitters of which are coupled respectively to the collectors of said first emitter coupled pair of transistors, said common base amplifier transistors having substantially identical semiconductor junction characteristics as said first emitter coupled pair of transistors;*

*a correction amplifier channel comprising a second emitter coupled pair of transistors, the bases of which are coupled respectively to the collectors of said first emitter coupled pair of transistors, and the collectors of which are cross coupled to the collectors of said common base amplifier transistors; and*

*means for matching the gain of said main amplifier channel and said correction amplifier channel.*

*8. A feed forward amplifier in accordance with claim 7 wherein said gain-matching means comprises a pair of substantially equal-value resistances, one of which is disposed in the emitter path of said first emitter coupled pair of transistors, and the other of which is disposed in the emitter path of said second emitter coupled pair of transistors.*

*9. A feed forward amplifier in accordance with claim 7 further comprising a second pair of common-base amplifier transistors, the emitters of which are coupled respectively to the collectors of the first-mentioned pair of common-base amplifier transistors.*

* * * * *